United States Patent [19]

Hayashida et al.

[11] Patent Number: 5,461,657
[45] Date of Patent: Oct. 24, 1995

[54] X-RAY MIRROR, AND X-RAY EXPOSURE APPARATUS AND DEVICE MANUFACTURING METHOD EMPLOYING THE SAME

[75] Inventors: Masami Hayashida, Yokohama; Yutaka Watanabe, Isehara, both of Japan

[73] Assignee: Canon Kabushiki Kaisha, Tokyo, Japan

[21] Appl. No.: 266,749

[22] Filed: Jun. 28, 1994

[30] Foreign Application Priority Data

Jun. 30, 1993 [JP] Japan ................. 5-161791

[51] Int. Cl.$^6$ .................................... G21K 1/00
[52] U.S. Cl. ............................. 378/84; 378/145
[58] Field of Search ................. 378/84, 145, 82, 378/34, 43

[56] References Cited

U.S. PATENT DOCUMENTS

| | | | |
|---|---|---|---|
| 3,424,428 | 1/1969 | Canon | 378/84 X |
| 4,842,665 | 6/1989 | Taguchi et al. | 378/84 X |
| 5,042,059 | 8/1991 | Watanabe et al. | 378/145 |
| 5,123,036 | 6/1992 | Uno et al. | 378/34 |
| 5,125,014 | 6/1992 | Watanabe et al. | 278/34 |
| 5,307,395 | 4/1994 | Seely et al. | 378/84 |

FOREIGN PATENT DOCUMENTS

| | | |
|---|---|---|
| 106703 | 5/1988 | Japan . |
| 158298 | 6/1992 | Japan . |
| 8800 | 2/1993 | Japan . |

OTHER PUBLICATIONS

Barbee, Jr., "Sputtered Layered Synthetic Microstructure (LSM) Dispersion Elements," American Institute of Physics, No. 75, 1981, pp. 131–143.

*Primary Examiner*—David P. Porta
*Attorney, Agent, or Firm*—Fitzpatrick, Cella, Harper & Scinto

[57] ABSTRACT

An X-ray mirror has a silicon carbide substrate having a convex cylindrical surface, and a carbon layer coated on a surface of said substrate to a thickness ranging from 10 nm to 1 μm by evaporation, such as CVD. In the X-ray mirror in which the carbon layer is coated thereon beforehand, changes in the intensity of reflected light, caused by a contaminating carbon layer attached to the surface of the mirror, can be restricted. When such a mirror is used in an X-ray lithographic apparatus, the number of times the intensity of X-rays is measured or corrected or the mirror is cleaned can be greatly reduced.

12 Claims, 9 Drawing Sheets

X-RAY MIRROR, AND X-RAY EXPOSURE APPARATUS AND DEVICE MANUFACTURING METHOD EMPLOYING THE SAME

BACKGROUND OF THE INVENTION

1. Field of the Invention

The present invention relates to an X-ray mirror and an X-ray exposure apparatus which employs the X-ray mirror.

2. Description of the Related Art

Grazing incidence X-ray mirrors utilize total reflection on the surface of a subject, and thus must have a very high accuracy in shape and flatness. In recent years, X-ray sources having a high luminance, such as synchrotron radiation, have been employed. Thus, there is a demand for a grazing incidence X-ray mirror which exhibits high heat resistance and radiation resistance in addition to the above-mentioned characteristics. Generally, a grazing incidence X-ray mirror is obtained by optically polishing the surface of a substrate made of quartz obtained by coating silicon carbide on a base material, silicon carbide or carbon by chemical vapor deposition (CVD). In order to improve heat resistance and polishing characteristics, a substrate made of metal or silicon may be used. Further, in order to improve heat resistance, radiation resistance and the wavelength dependency of the reflectivity of the grazing incidence X-ray mirror, a metal layer made of, for example, gold or platinum, may be coated on the surface of the substrate made of any of the above-mentioned materials.

When the X-ray mirror is placed in a beam line of X-rays, such as synchrotron radiation and is illuminated with X-rays, a contaminating carbon layer is generated on the X-ray irradiating surface thereof due to residual organic substances present in the atmosphere. The attached contaminating carbon layer greatly varies the intensity and spectrum of X-rays reflected by the X-ray mirror. Hence, intensity correction must be conducted frequently or the mirror must be cleaned often. Further, variations in the position at which X-rays enter the mirror generate a distribution of the intensity of the reflected X-rays caused by the presence or absence of the contaminating carbon layer.

In recent years, the luminance of light sources have increased, and consequently, an influence of the contaminating carbon layer on the intensity and spectrum of the illuminating X-rays has thus become a serious problem.

Hence, attempts have been made to reduce the speed at which the contaminating carbon layer is attached by improving the degree of vacuum of the beam line or by cooling the mirror.

However, it has been reported that carbon contamination occurs even in a vacuum of $10^{-9}$ Torr. Further, the cooling method has been proposed to mainly improve the heat load of associated optical elements. Regarding the carbon contamination of optical elements, it has been reported that a reduction in the temperature of the optical elements tends to advance carbon contamination.

Further, a method of removing a contaminating carbon layer of the optical elements in a beam line has been proposed. This method facilitates cleaning of the mirror. However, when the mirror is significantly contaminated, it must be cleaned frequently. Thus, it is desired to restrict changes in the intensity of the reflected X-rays and reduce the number of times the mirror is cleaned.

In X-ray lithography, since the amount of X-rays to which a resist is exposed must be very accurate, the amount must be corrected even when the mirror is slightly contaminated. However, frequently conducted correction of the amount of X-rays exposed and mirror cleaning reduce throughput. Accordingly, it is desired to stabilize the intensity of X-rays reflected by the X-ray mirror over a long period of time. Further, in X-ray lithography employing synchrotron radiation as the light source, variations in the position of a beam vary the position on the mirror on which X-rays are illuminated, thus generating a distribution of the thickness of the contaminating carbon layer and hence irregularities of the X-ray reflectivity. This results in changes in the intensity of X-rays in the exposed plane and thus must be eliminated.

Japanese Patent Laid-Open No. Hei 4-158298 discloses a mirror in which a carbon layer having a thickness of 2 to 20 µm is provided on the surface of a silicon carbide substrate in order to increase the coefficient of heat conductivity of the mirror. However, if the carbon layer having such a thickness is provided in order to achieve a reduction of changes in the reflectivity caused by the presence of a contaminating carbon layer, it is difficult to obtain a desired stability in reflectivity, because irregularities in the reflectivity caused by a distribution of the thickness of the carbon layer increase.

SUMMARY OF THE INVENTION

An object of the present invention is to provide a grazing incidence X-ray mirror in which a carbon layer is provided as the outermost layer in order to reduce changes in the intensity of reflected X-rays due to contaminating carbon, which becomes attached to the reflecting mirror.

In order to achieve the above object, the present invention provides an X-ray mirror which is characterized in that a carbon layer having a thickness ranging from 10 nm to 1 µm is manufactured on a grazing incidence reflecting surface thereof.

In another aspect, the present invention provides an X-ray optical device comprising a grazing incidence X-ray mirror having a reflecting surface for reflecting X-rays, and a carbon layer manufactured on a surface of the reflecting surface, the carbon layer having a thickness ranging from 10 nm to 1 µand illumination means for illuminating the mirror with X-rays.

In another aspect, the present invention provides an X-ray exposure apparatus comprising a light source for generating X-rays, a grazing incidence X-ray mirror having a reflecting surface for reflecting X-rays and a carbon layer manufactured on a surface of the reflecting surface, the carbon layer having a thickness ranging from 10 nm to 1 µand exposure means for illuminating the X-ray mirror with X-rays from the light source and for exposing a substrate to X-rays reflected by the X-ray mirror.

In yet another aspect, the present invention provides a method of manufacturing devices that includes steps of causing X-rays to be incident on a grazing incidence X-ray mirror having a reflecting surface for reflecting the X-rays and a carbon layer manufactured on the reflecting surface, the carbon layer having a thickness ranging from 10 nm to 1 µand illuminating a mask with X-rays incident on the X-ray mirror and reflected thereby to print a pattern on the mask onto a substrate.

In still a further aspect, the present invention provides a method of manufacturing an X-ray mirror that includes steps of providing an X-ray mirror having a reflecting surface and manufacturing a carbon layer having a thickness ranging from 10 nm to 1 μm on the reflecting surface of the X-ray mirror.

In a grazing incidence X-ray mirror in which a carbon layer is present on the reflecting surface thereof, changes in the intensity of X-rays reflected by the reflecting surface, caused by changes in the thickness of the carbon layer, are great when the thickness of the carbon layer is small, and reduce as the thickness thereof increases. Thus, changes in the intensity of X-rays reflected can be limited by providing a layer of carbon on the reflecting surface of the mirror beforehand.

Although changes in the intensity of X-rays reflected relative to changes in the thickness of the carbon layer depend on the material of the mirror, the wavelength of X-rays or the angle of incidence, they are extremely great when the thickness of the carbon layer is 10 nm or less. Above 10 nm, changes in the intensity of X-rays become stable as the thickness of the carbon layer increases.

Since changes in the intensity of X-rays are great when the thickness of the carbon layer is 10 nm or less, the provision of a carbon layer having a thickness of more than 10 nm is desirable. The optimum thickness of the carbon layer is determined by a desired wavelength, angle of incidence and stability of the intensity of the X-rays relative to the thickness of the carbon layer. A high degree of stability of the intensity of X-rays can be obtained by increasing the thickness of the carbon layer. The effect on the stability of the intensity of the X-rays becomes saturated as the thickness increases.

However, when the thickness of the carbon layer is increased, a desired distribution of the intensity of X-rays reflected cannot be obtained due to a distribution of the thickness of the carbon layer in the reflecting surface. When the carbon layer is coated by an evaporation process, a distribution of the thickness in the reflecting surface is generally between 1 μand several percent. When the thickness of the carbon layer exceeds 1 μm, a distribution of the intensity of X-rays reflected due to a distribution of the thickness of the carbon layer becomes several percent or more. Irregularities of the reflectivity due to the presence of the contaminating carbon layer can be reduced to 1 to several percent by coating the carbon layer beforehand. Accordingly, the provision of a carbon layer having a thickness of 1 μm or more increases the irregularities of the reflectivity caused by a distribution of the thickness of the carbon layer rather than reducing the irregularities of the reflectivity caused by the presence of the contaminating carbon layer. Thus, an adequate thickness of the carbon layer coated on the surface of the mirror is 1 μm or less.

When an adequate thickness of the carbon layer coated beforehand is determined, the conditions of use of an optical element (the wavelength, the angle of incidence and intensity of X-rays), a desired stability of the intensity of the X-rays relative to the thickness of the contaminating carbon layer and the speed at which the contaminating carbon is attached to the optical element in an optical device being used are taken into consideration.

Generally, changes in the intensity of X-rays are the greatest when the contaminating carbon layer first begins to be attached. Thus, the thickness of the carbon layer is set such that changes in the intensity of X-rays with time when the contaminating carbon layer first begins to be attached exhibit a desired stability in the intensity of the X-rays. That is, the thickness of the carbon layer is set such that changes in the intensity of X-rays with time, $dI/dt$, caused by the contaminating layer being attached after the carbon layer is coated, satisfy the following conditions when the carbon layer first begins to be attached:

$dI/dt$ (the thickness of the contaminating layer=0 nm)<$R/T$ where T is a desired period of use and R represents changes in the intensity allowable in that period.

Changes in the intensity of X-rays, $dI/dx$, relative to the thickness x of the contaminating carbon layer satisfy the following conditions:

$dI/dx$ (the thickness of the contaminating carbon layer=0 nm)<$R/(v \cdot T)$ where v is the rate at which the contaminating carbon layer becomes attached to an optical element in an X-ray optical device that is used. The optimum thickness of the carbon layer is set such that it satisfies the above equations and such that it ensures a sufficient intensity stability.

In an X-ray lithography apparatus, errors in the amount of exposure generate errors in the line width of a transferred pattern. If the allowance of the line width error is, for example, ±2.5%, desired changes in the intensity of X-rays exposed are 1% or less with other factors of generating the line width error taken into consideration. To achieve this, changes in the intensity of X-rays, which would occur between the adjacent corrections of the exposing time, must be 1% or less.

Since it takes about 30 minutes or more for the exposing time to be corrected, if such an exposing time correction is conducted at least once a day, throughput is greatly reduced. Thus, if the allowable changes in the amount of X-rays exposed between the adjacent exposing time corrections are 1% or less, as mentioned above, the X-ray intensity stability per day must be restricted to 1% or less. Accordingly, the carbon layer is coated on the surface of the mirror beforehand in such a manner that it ensures that changes in the intensity of X-rays when the contaminating layer first begins to be attached are 1% or less per day.

In X-ray multi-layer reflecting mirrors or crystal diffraction gratings, it has been proposed to coat a carbon layer in order to protect the multi-layers from being deteriorated, e.g., oxidized or to reduce total reflection (Japanese Patent Publication No. Hei 5-8800 and Japanese Patent Laid-Open No. Sho 63-106703).

In a multi-layer reflecting mirror that utilizes Bragg diffraction in which a layer is coated on the surface thereof, since that layer absorbs X-rays greatly, the reflectivity of the mirror is reduced. Hence, normally, an extremely thin carbon layer is coated or the thickness of the carbon layer is set such that it satisfies diffraction conditions. T. W. Barbee has reported the differences in the reflectivity of a V/C (Vanadium/Carbon) multi-layer film that occur between the uppermost layer being a V layer and the uppermost layer being a C layer (AIP c Conf. Proc. No. 75, 131 (1981)). According to this report, when a C layer is provided as the uppermost layer, the reflectivity greatly reduces as compared with that when the uppermost layer is a V layer. In that case, diffraction conditions are satisfied by the C layer. If the C layer does not satisfy diffraction conditions, the reflectivity further reduces. Accordingly, in the case of a multi-layer reflecting mirror, the provision of a carbon layer for the purpose of, for example, preventing deterioration of the multi-layer is effective if it is within a range in which little or no reduction in the reflectivity is caused, or if other methods of reducing changes in the reflection intensity are inadequate.

Crystal diffraction gratings are generally used with short wavelengths, and changes in the reflectivity due to the attached contaminating carbon layer thus do not cause a serious problem.

In contrast, grazing incidence mirrors utilize total reflection, and are thus sensitive to changes in the state of the surface caused by, for example, attached contaminating carbon. Changes in the reflectivity of the grazing incidence mirror can be effectively reduced by the method of the present invention. The method according to the present invention is particularly effective in an X-ray lithographic apparatus which has very strict requirements against changes in the intensity of X-rays.

The coated carbon layer according to the present invention must have substantially uniform thickness. The carbon layer is formed by, for example, sputtering or CVD. A carbon layer having an optical constant close to that of the contaminating carbon layer is desirable. Normally, the contaminating carbon layer has a far lower density than that of bulk graphite. Thus, the provision of a carbon layer having a low density and an optical constant close to that of a contaminating carbon layer by sputtering or CVD is desired.

The grazing incidence mirror according to the present invention is more effective if it is combined with any of the above-described methods of reducing the rate at which contaminating carbon is attached.

DETAILED DESCRIPTION OF THE PREFERRED EMBODIMENTS

Example 1

Figure 1:
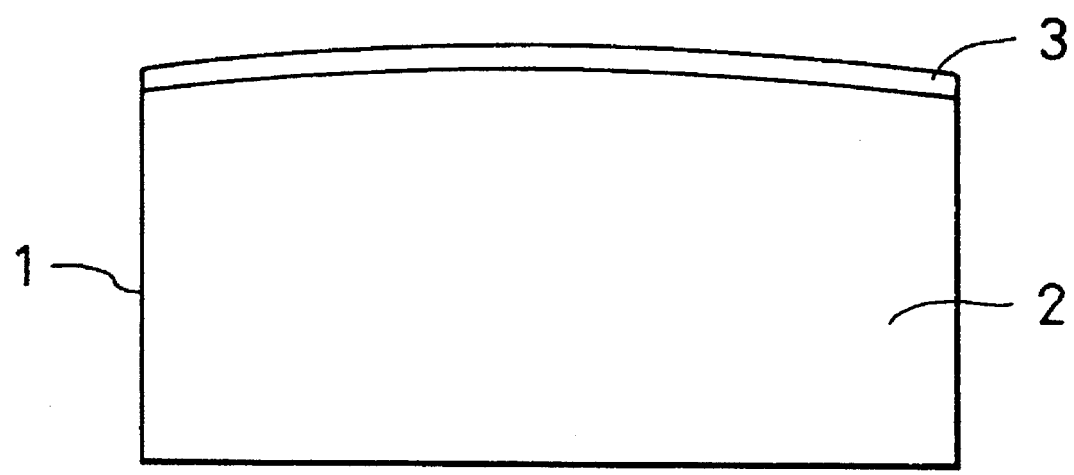
FIG. 1 is a schematic cross-sectional view of an embodiment of an X-ray reflecting mirror according to the present invention.

FIG. 1 is a schematic cross-sectional view of an embodiment of a grazing incidence X-ray mirror according to the present invention. An X-ray reflecting mirror 1 includes a silicon carbide substrate 2 having a convex cylindrical surface, and a carbon layer 3 coated on the substrate 2 to a thickness of 30 nm.

Figure 2:
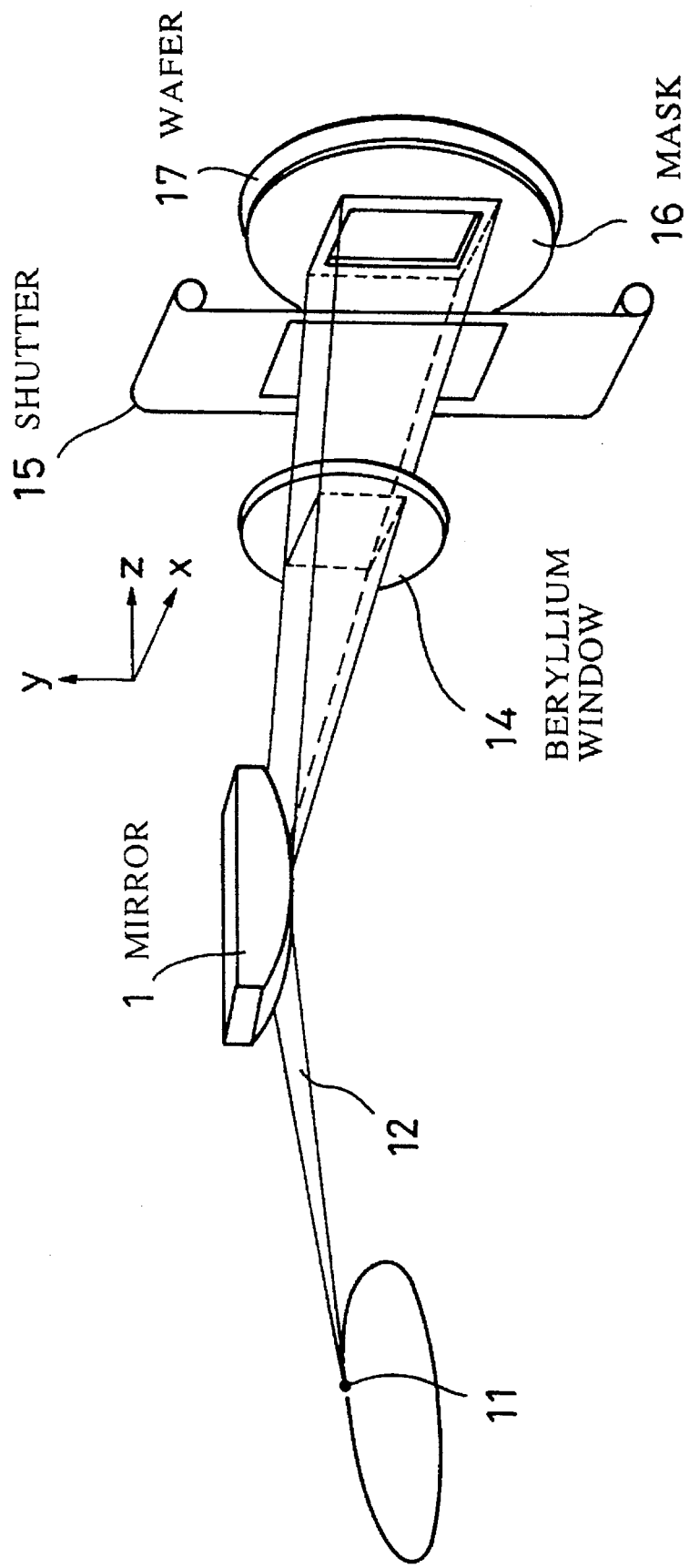
FIG. 2 is a schematic view of an X-ray lithographic apparatus employing the mirror shown in FIG. 1.

FIG. 2 shows an X-ray lithographic apparatus employing the mirror shown in FIG. 1. Synchrotron radiation having electron energy of 2.5 GeV and an orbital radius of 8.66 m was used as a light source. Synchrotron X-rays (SR-X-rays) emitted from a light emitting point 1a are made incident on the mirror at an angle of incidence of 20 mmrad, and then introduced into an exposure chamber (not shown) filled with helium at 150 Torr through a thin beryllium window 14 having a thickness of 20 µm so as to transfer a mask pattern formed on a 2 µm-thick silicon nitride membrane of an X-ray mask 16 onto a resist coated on a wafer 17. The amount of X-rays exposed is controlled by a shutter 15. The intensity of X-rays was measured by an X-ray detector (not shown) so that the amount of X-rays exposed could be maintained constant by controlling the exposure time of the shutter 15 when the intensity of the X-rays was varied.

When the X-ray lithographic apparatus shown in FIG. 2 was used under a degree of vacuum on the order of $10^{-7}$ Pa while no X-rays illuminated the X-ray mirror and on the order of $10^{-6}$ Pa while the X-ray mirror was illuminated with X-rays, the rate at which the contaminating layer was attached was about 1.2 nm/day. Thus, if an allowance of the intensity of X-rays exposed is 1% and if the amount of X-rays exposed is corrected once a day, the thickness of the carbon layer is set such that changes in the intensity of the X-rays relative to the thickness of the contaminating carbon layer, $dI/dx$, when the contaminating layer first begins to be attached is 0.83%/nm or less when the rate of attachment is the above-mentioned value.

Figure 3:
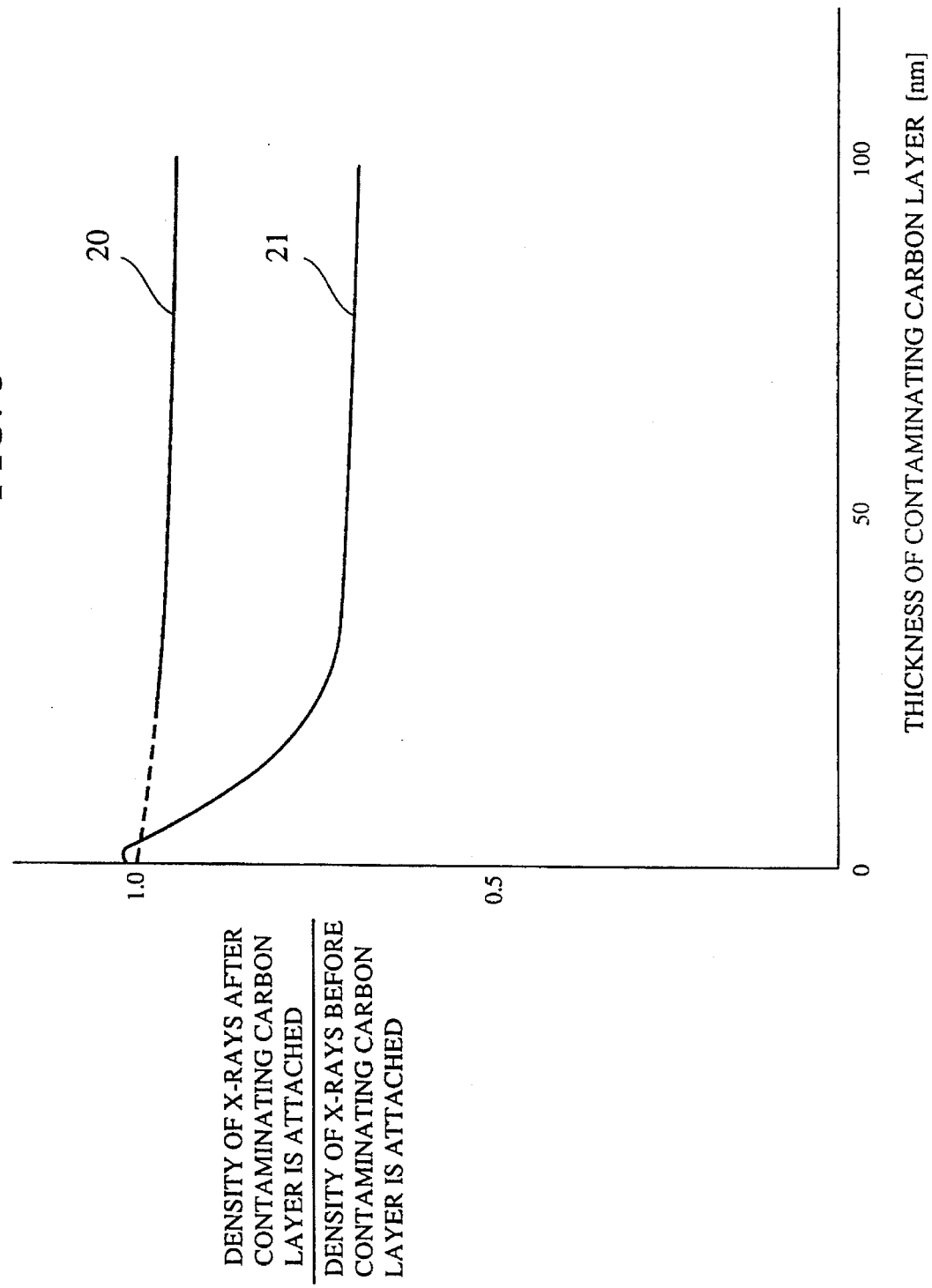
FIG. 3 and FIGS. 6 through 8 are graphic representations showing the relation between the thickness of a contaminating carbon layer and changes in the intensity of X-rays.

FIG. 3 is a graph showing changes in the intensity of X-rays on a resist relative to the thickness of the contaminating carbon when the mirror is contaminated by attached carbon. Reference numeral 21 indicates changes in the intensity of X-rays when no coating has been performed on the mirror. Changes in the intensity of X-rays at the initial stage of attachment of the contaminating layer was about 1.8%/nm (i.e., 2.16%/day). When a carbon layer is coated on the mirror indicated by reference numeral 1, changes in the intensity of X-rays can be restricted to 0.83%/nm or less by making the thickness of the coated carbon layer 10 nm or more. Reference numeral 20 indicates changes in the intensity of X-rays on the resist relative to the thickness of the contaminating carbon layer when a carbon layer having a thickness of 30 nm is coated with sufficient stability taken into consideration. In the case of a mirror on which coating is performed, changes in the intensity of X-rays are about 0.1%/nm. Whereas the intensity of X-rays greatly changes with respect to a mirror on which no coating is conducted even when a thin contaminating carbon layer is attached thereto, the intensity of X-rays is very stable with respect to a mirror on which coating is performed. That is, stability of the intensity of X-rays is greatly improved when the mirror is coated in advance.

Example 2

An X-ray lithographic apparatus having the same structure as that of the apparatus used in Example 1 was used. The angle of incidence was 15 mrad, and a quartz mirror was used. An X-ray mask having a 2 µm-thick silicon carbide membrance and 12 µm-thick beryllium window was used.

Figure 4:
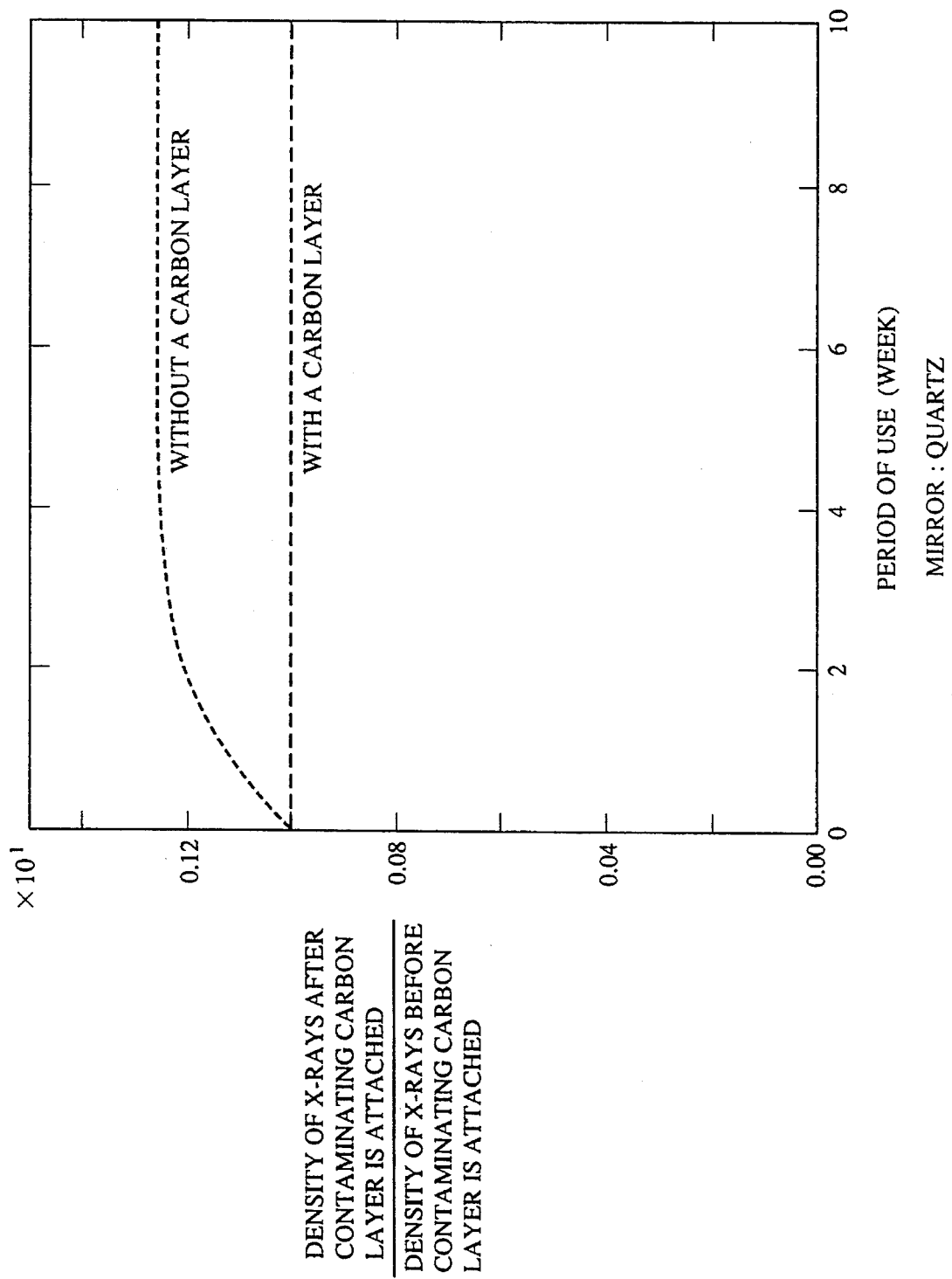
FIGS. 4 and 5 are graphic representations showing the relation between the periods of use and changes in the intensity of X-rays.

FIG. 4 is a graph showing both changes in the density of X-rays with time on the resist with respect to a mirror on which no carbon layer is coated and those with respect to a mirror on which a carbon layer having a thickness of 30 nm is coated beforehand. It is assumed that the measurement of the amount of X-rays exposed and correction of the exposing time are conducted once a week, and that the allowance of changes in the density of X-rays caused by the mirror contamination is 1% or less per week. Regarding the mirror on which no coating is performed, the density of X-rays increases at a rate of 30%/week at the initial stage of use, and increases by about 21% a week thereafter. Regarding the mirror on which the carbon layer is coated beforehand, the density of X-rays changes at a rate of 0.3%/week at the initial stage of use, and changes in the intensity a week after the mirror is in use are about 0.3%. This value is sufficiently less than an allowed value, and correction of the X-ray intensity is thus unnecessary during that time.

Example 3

In the above-described X-ray lithographic apparatus, since the intensity of the radiation is distributed in a direction perpendicular to the orbital surface of the synchrotron, the thickness of the contaminating layer attached to the mirror is distributed according to that intensity distribution. Accordingly, a distribution of the intensity of X-rays within an exposure area changes due to the attached contaminating layer.

Figure 5:
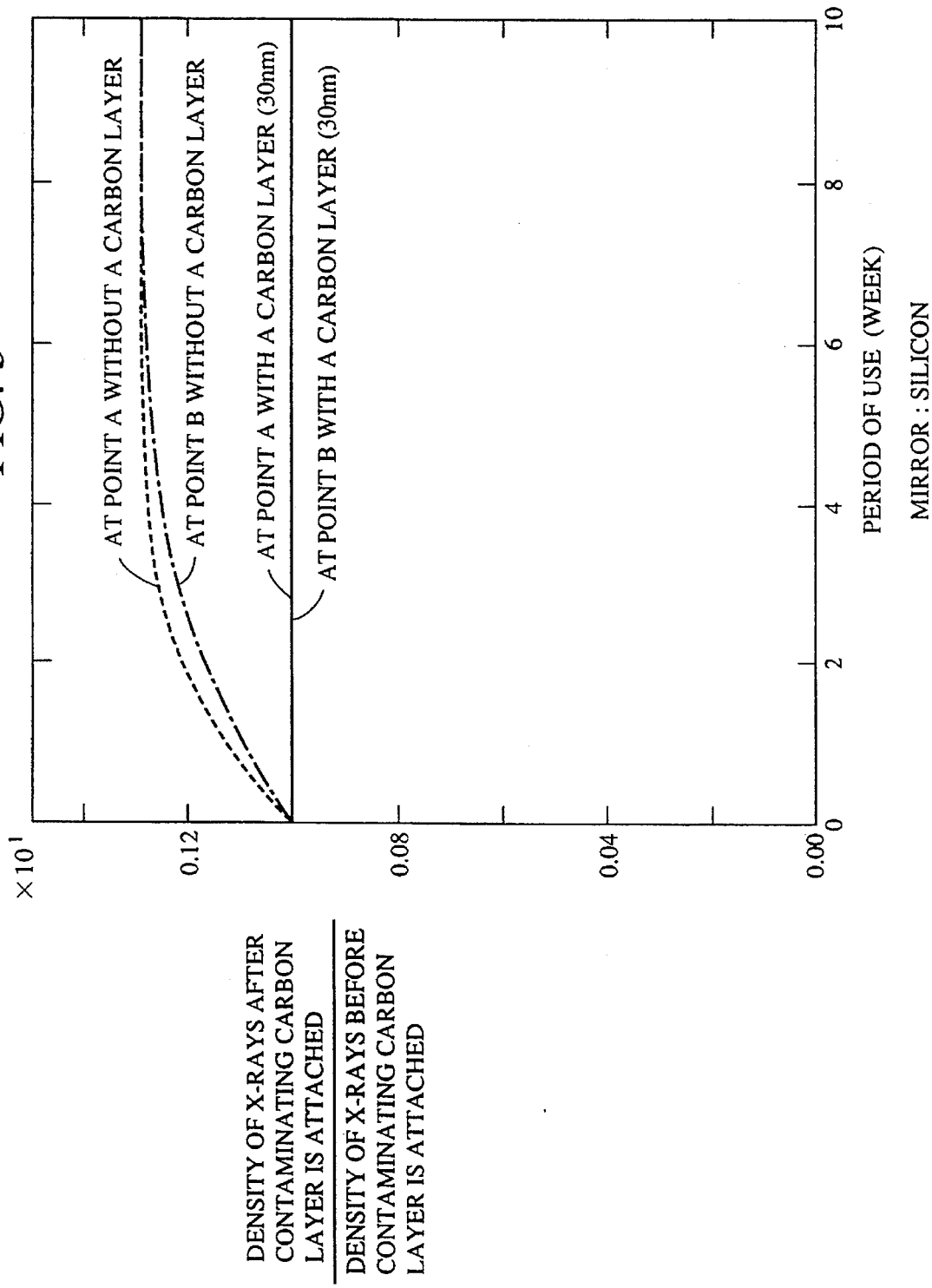

FIG. 5 is a graph showing changes in the intensity of X-rays with time in the above-described lithographic apparatus employing a silicon mirror at a point A where the density of X-rays is the highest within the exposure area and at a point B separated in an upward direction from point A by about 12 mm. In a mirror on which no coating is performed, the density of X-rays changes at a rate of 28/% week at the initial stage of use (at the initial stage of attachment of the contaminating layer) at point A in the exposure area, and increases by 21% a week thereafter. At point B, the density of X-rays changes at a rate of 20/% week at the initial stage of use, and increases by 15% a week thereafter.

Since changes in the density of X-rays differ between points A and B, not only is the entire exposing time, but also the exposing time of each portion in the exposing area, corrected according to the thickness of the contaminating layer attached to the mirror. That is, the shutter moving speed must be changed locally.

Assuming that the X-ray lithographic apparatus is used under the same conditions as those of Example 2, that the exposing time is corrected once a week, and that changes in the amount of X-rays exposed is 1% or less, a carbon layer having a thickness ensuring that changes in the density of X-rays at the initial stage of use at point A where the density of X-rays is the highest is 1%/week or less is coated beforehand in this case.

FIG. 5 also shows changes in the density of X-rays with time at points A and B in a mirror in which a carbon layer having a thickness of 30 nm is coated. At both points A and B, the density of X-rays at the initial stage of use changes at a rate of about 0.1%/week, which is sufficiently lower than an allowed amount. Thus, correction of the intensity is unnecessary during that time.

Example 4

In this example, an X-ray lithographic apparatus having the same structure as that of the apparatus employed in Examples 2 and 3 was used. Synchrotron radiation having electron energy of 0.7 GeV and an orbital radius of 0.7 m was used as the light source. A mirror in which a 20 nm-thick gold layer was coated on quartz through a 5 nm-thick chromium layer therebetween as a sublayer was used.

Figure 6:
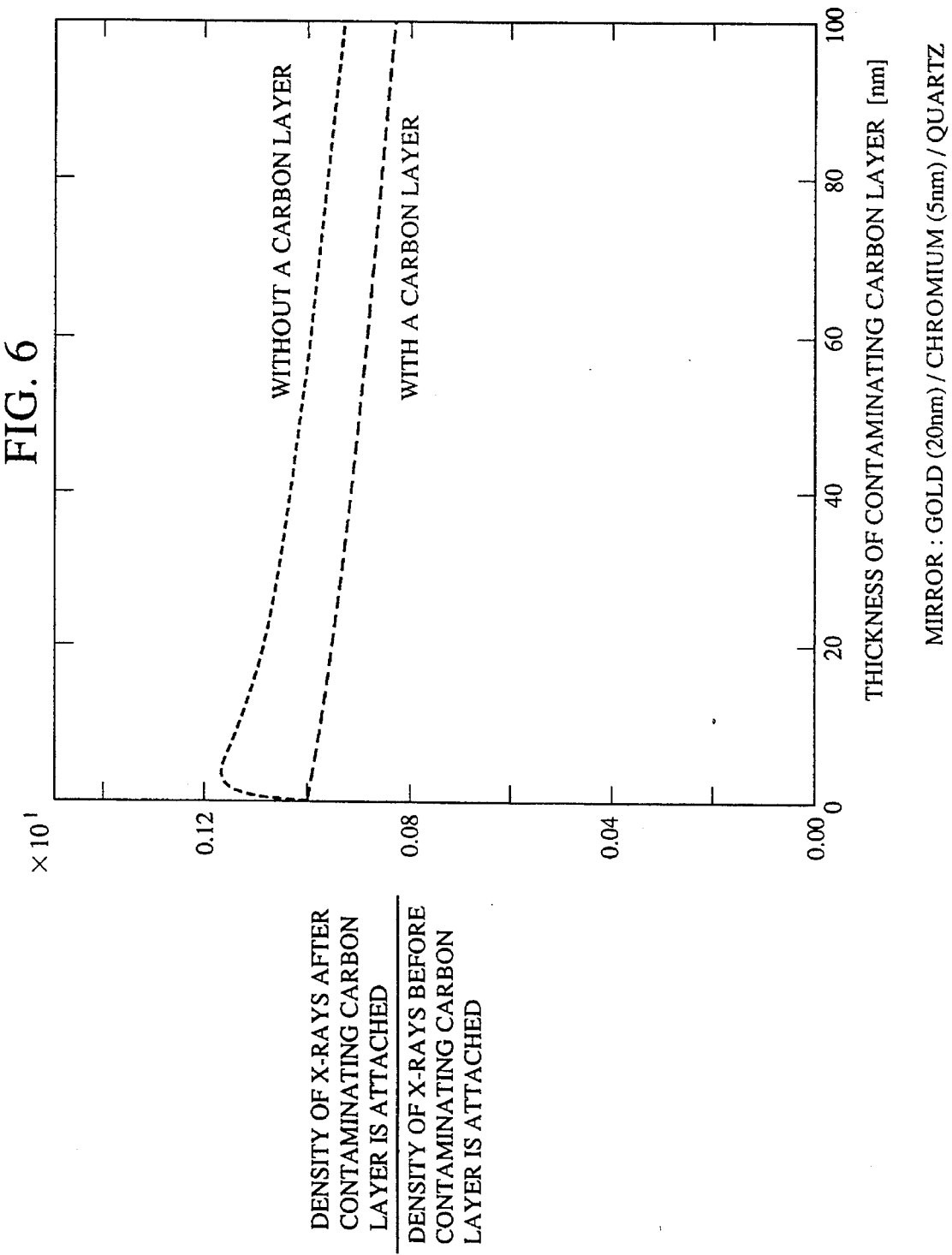

FIG. 6 shows changes in the density of X-rays on the resist according to the thickness of the contaminating layer in the above-described X-ray lithographic apparatus. A mirror on which a 40 nm-thick carbon layer is coated thereon beforehand does not result in great changes in the density of X-rays, which are otherwise observed in a mirror on which no carbon layer is first coated, but the thickness of the contaminating carbon layer varies from 1 to 30 nm.

Figure 7:
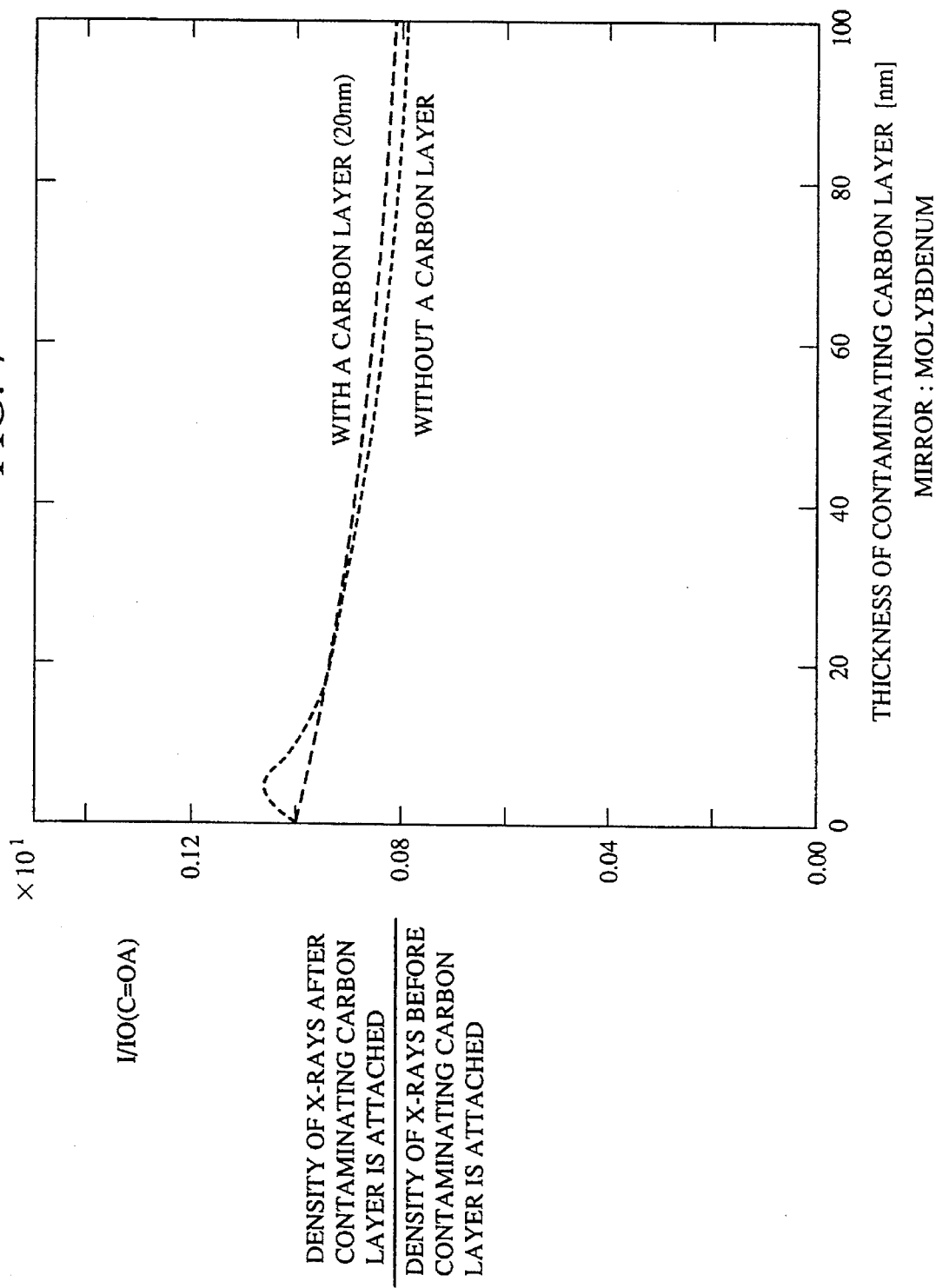
Figure 8:
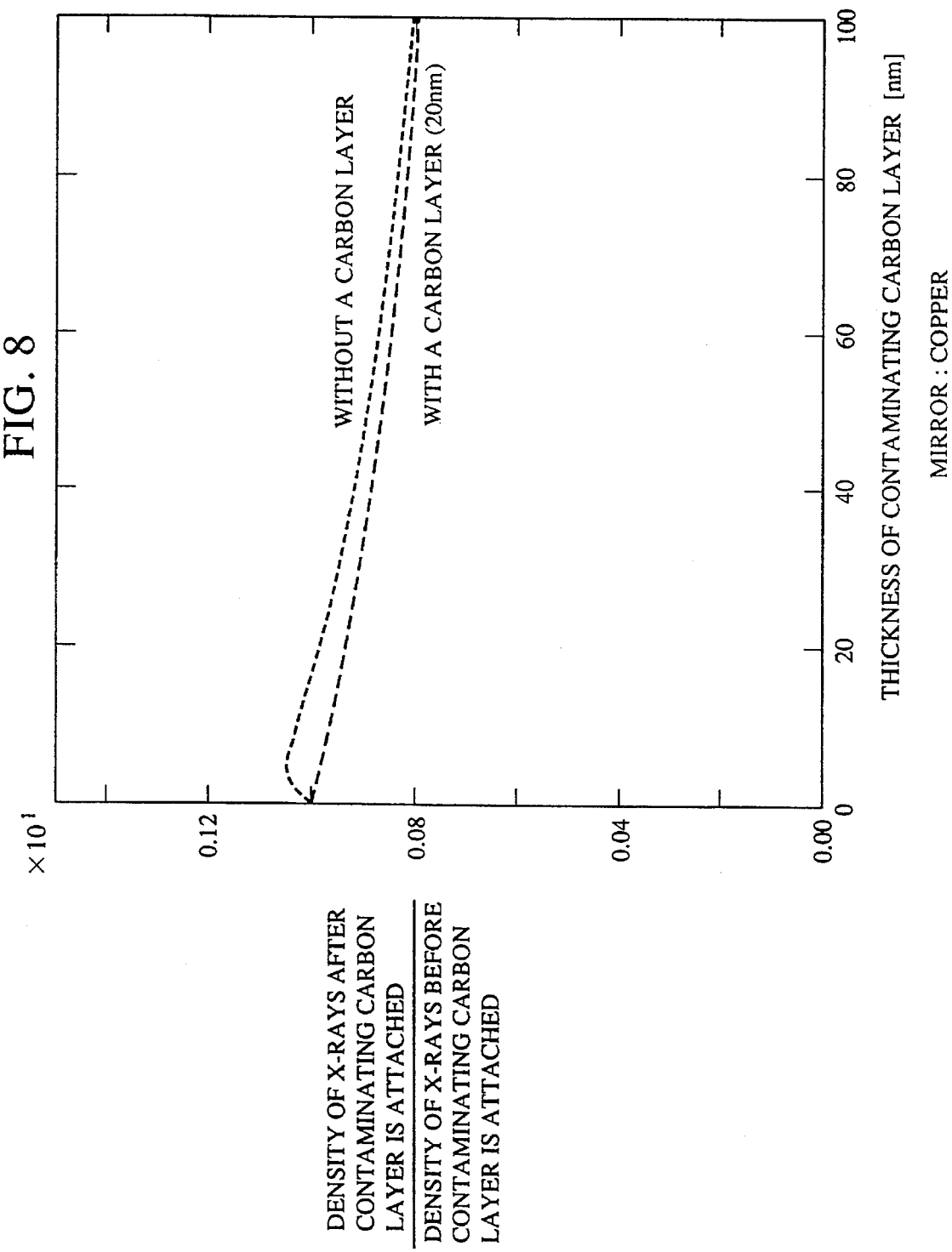

FIGS. 7 and 8 show the results obtained in the same lithographic apparatuses respectively employing molybdenum and copper mirrors. In the mirror on which the carbon layer is coated beforehand, changes in the density of X-rays, which would be observed at the initial stage of the attachment of the contaminating layer, are not seen. Thus, correction of the intensity of X-rays, conducted at the initial stage of use several times, or waiting for stabilization of the intensity of X-rays is not necessary.

As will be understood from the foregoing description, in an X-ray mirror in which a carbon layer is coated thereon to a thickness ranging from 10 nm to 1 μm beforehand, changes in the intensity of reflected light, caused by a contaminating carbon layer becoming attached to the surface of the mirror, can be restricted. When such a mirror is used in an X-ray lithographic apparatus, the number of times the intensity of X-rays is measured or corrected, or the mirror is cleaned, can be greatly reduced. This is very advantageous in a practical operation.

Figure 9:
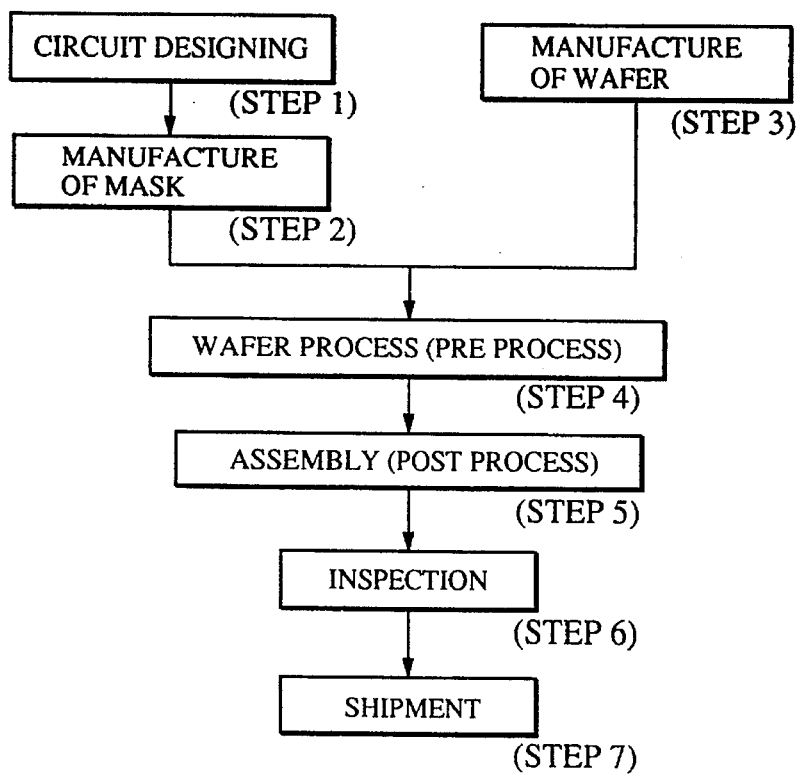
FIG. 9 illustrates the flow of manufacturing devices.

An embodiment of a method of manufacturing devices utilizing the X-ray lithographic apparatus which has been described in connection with FIG. 2 will now be described. FIG. 9 shows the flow of manufacturing miniature devices (semiconductor chips, such as ICs or LSIs, liquid crystal panels, CCDs, thin-film magnetic heads or micromachines). In step A (circuit designing), the circuits of the semiconductor devices are designed. In step 2 (mask manufacture), a mask on which the designed circuit pattern is formed is manufactured. In step 3 (wafer manufacture), a wafer is manufactured using a material, such as silicon. In step 4 (wafer process) called the pre-process, the prepared mask and wafer are used to form an actual circuit on the wafer by the lithographic process. In step 5 (assembly) called the post process, semiconductor chips are formed using the wafer manufactured in step 4. Step 5 includes the assembly process (dicing, bonding), the packaging process (chip sealing) and so on. In step 6 (inspection), inspections, such as an operation check test and durability test, are conducted on the semiconductor devices manufactured in step 5. The semiconductor devices manufactured by the above processes are shipped in step 7.

Figure 10:
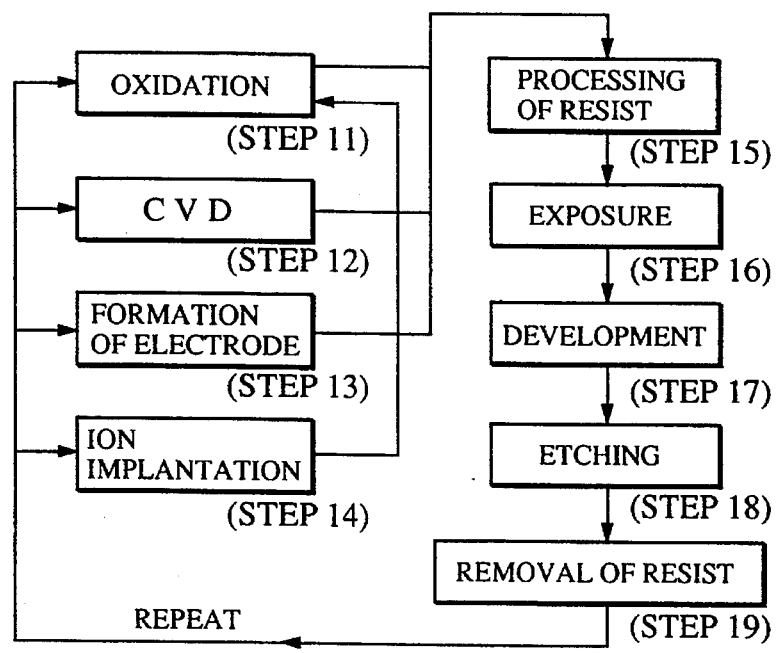
FIG. 10 illustrates the flow of a wafer process.

FIG. 10 shows the flow of the wafer process. In step 11 (oxidation), the surface of the wafer is oxidized. In step 12 (CVD), an insulator film is formed on the surface of the wafer. In step 13 (electrode formation), electrodes are formed on the wafer by evaporation. In step 14 (ion implantation), ions are implanted in the wafer. In step 15 (resist process), a resist is coated on the wafer. In step 16 (exposure), the circuit pattern on the mask is transferred to the wafer by the above-described X-ray lithographic apparatus. In step 17 (development), the exposed wafer is developed. In step 18 (etching), the portion of the wafer other than the developed resist image is removed. In step 19 (removal of resist), the resist used for etching is removed. The above-described steps are repeated to form a multi-level circuit pattern on the wafer. Devices having a high complexity, which were difficult to manufacture conventionally, can be manufactured using the manufacturing method according to the present invention.

Except as otherwise disclosed herein, the various components shown in outline or in block form in the figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:
1. An X-ray mirror, comprising:

a grazing incidence reflecting surface for reflecting X-rays; and a carbon layer manufactured on a surface of said reflecting surface and having a thickness ranging from 10 nm to 1 µm.

2. An X-ray mirror according to claim 1, wherein said carbon layer has a substantially uniform thickness.

3. An X-ray mirror according to claim 1, wherein said reflecting surface has a predetermined curvature.

4. An X-ray mirror according to claim 1, wherein said reflecting surface is in the form of a substrate containing silicon carbide.

5. An X-ray optical device, comprising:

a grazing incidence X-ray mirror having a reflecting surface for reflecting X-rays, and a carbon layer manufactured on the reflecting surface, said carbon layer having a thickness ranging from 10 nm to 1 µm; and illumination means for illuminating said X-ray mirror with X-rays.

6. An X-ray optical device according to claim 5, wherein said illumination means comprises a synchrotron radiation light source for emitting an X-ray beam.

7. An X-ray optical device according to claim 6, wherein said X-ray mirror expands X-rays emitted from said synchrotron radiation light source in a predetermined direction by reflecting the X-ray beam.

8. An X-ray exposure apparatus, comprising:

a light source for generating X-rays;

a grazing incidence X-ray mirror having a reflecting surface for reflecting X-rays, and a carbon layer manufactured on a surface of said reflecting surface, said carbon layer having a thickness ranging from 10 nm to 1 µm; and exposure means for illuminating said X-ray mirror with X-rays from said light source and for exposing a substrate to X-rays reflected by said X-ray mirror.

9. An X-ray exposure apparatus according to claim 8, wherein said exposure means illuminates a mask with the reflected X-rays to print a pattern on the mask onto the substrate.

10. A method of manufacturing devices, said method comprising the steps of:

causing X-rays to be incident on a grazing incidence X-ray mirror having a reflecting surface for reflecting the X-rays, and a carbon layer manufactured on the reflecting surface, the carbon layer having a thickness ranging from 10 nm to 1 µm; and illuminating a mask with the X-rays incident on the X-ray mirror and reflected thereby to print a pattern on the mask onto a substrate.

11. A method of manufacturing an X-ray mirror, said method comprising the steps of:

providing an X-ray mirror having a reflecting surface; and manufacturing a carbon layer having a thickness ranging from 10 nm to 1 µm on the reflecting surface of the X-ray mirror.

12. A method according to claim 11, wherein the carbon layer is manufactured by chemical vapor deposition.

* * * * *

UNITED STATES PATENT AND TRADEMARK OFFICE
CERTIFICATE OF CORRECTION

PATENT NO.   : 5,461,657
DATED        : October 24, 1995
INVENTOR(S)  : Masami HAYASHIDA, et al.

It is certified that error appears in the above-indentified patent and that said Letters Patent is hereby corrected as shown below:

COLUMN 2:

Line 43, "1 $\mu$and" should read --1$\mu$ and--.
Line 51, "1 $\mu$and" should read --1$\mu$ and--.
Line 61, "1 $\mu$and" should read --1$\mu$ and--.

COLUMN 3:

Line 1, "1 $\mu$on" should read --1$\mu$ on--.

COLUMN 5:

Line 59, "150 Tort" should read --150 Torr--.
Line 61, "membrance" should read --membrane--.

COLUMN 6:

Line 43, "membrance" should read --membrane--.

Signed and Sealed this

Ninth Day of April, 1996

Attest:

BRUCE LEHMAN

*Attesting Officer*  *Commissioner of Patents and Trademarks*